United States Patent
Kang et al.

(10) Patent No.: US 6,498,745 B2
(45) Date of Patent: Dec. 24, 2002

(54) CIRCUIT FOR GENERATING TIMING OF REFERENCE PLATE LINE IN NONVOLATILE FERROELECTRIC MEMORY DEVICE AND METHOD FOR DRIVING REFERENCE CELL

(75) Inventors: Hee Bok Kang, Taejon-shi (KR); Hun Woo Kye, Kyoungki-do (KR); Je Hoon Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/987,945

(22) Filed: Nov. 16, 2001

(65) Prior Publication Data

US 2002/0057591 A1 May 16, 2002

(30) Foreign Application Priority Data

Nov. 16, 2000 (KR) ......................................... 2000-68112

(51) Int. Cl.$^7$ ............................................... G11C 11/22
(52) U.S. Cl. ................ 365/145; 365/185.2; 365/185.21
(58) Field of Search .............................. 365/145, 185.2, 365/185.25, 185.21

(56) References Cited

U.S. PATENT DOCUMENTS

| | | | |
|---|---|---|---|
| 4,873,664 A | 10/1989 | Eaton, Jr. ..................... 365/145 |
| 5,424,975 A | 6/1995 | Lowrey et al. .............. 365/145 |
| 5,432,731 A | 7/1995 | Kirsch et al. ................ 365/145 |
| 5,541,872 A | 7/1996 | Lowrey et al. .............. 365/145 |
| 5,638,318 A | 6/1997 | Seyyedy ....................... 365/145 |
| 5,680,344 A | 10/1997 | Seyyedy ....................... 365/145 |
| 5,682,344 A | 10/1997 | Seyyedy ....................... 365/145 |
| 6,333,870 B1 * | 12/2001 | Kang .......................... 365/117 |
| 6,335,877 B1 * | 1/2002 | Kang .......................... 365/145 |

\* cited by examiner

Primary Examiner—Richard Elms
Assistant Examiner—Hien Nguyen
(74) Attorney, Agent, or Firm—Morgan, Lewis & Bockius LLP

(57) ABSTRACT

In a circuit for generating timing of a reference plate line in the nonvolatile ferroelectric memory device, wherein a nonvolatile ferroelectric memory device having a reference cell includes a switching block controlled by a reference wordline signal, a level initiating block which selectively initiates a level of an input terminal of the switching block after receiving a reference equalizer signal, and a plurality of ferroelectric capacitors connected in parallel between the input terminal of the switching block and the reference plate line, the circuit includes a latch circuit receiving a first signal which has the same waveform as that of a chip enable signal and is not delayed and a second signal which has the same waveform as that of the chip enable signal and is delayed for a first period as the chip enable signal is generated, so as to output a low signal only in a delayed period of the second signal, and a delay circuit delaying the first and second signals of the latch circuit to output a low signal to the reference plate line.

9 Claims, 6 Drawing Sheets

US 6,498,745 B2

CIRCUIT FOR GENERATING TIMING OF REFERENCE PLATE LINE IN NONVOLATILE FERROELECTRIC MEMORY DEVICE AND METHOD FOR DRIVING REFERENCE CELL

This application claims the benefit of Korean Application No. P2000-68112 filed on Nov. 16, 2000, which is hereby incorporated by reference.

BACKGROUND OF THE INVENTION

1. Field of the Invention

The present invention relates to a semiconductor memory device, and more particularly, to a circuit for generating timing of a reference plate line in a nonvolatile ferroelectric memory device and a method for driving a reference cell. Although the present invention is suitable for a wide scope of applications, it is particularly suitable for improving a sensing margin by stabilizing a reference level in the nonvolatile ferroelectric memory device.

2. Discussion of the Related Art

Generally, a nonvolatile ferroelectric memory, i.e., a ferroelectric random access memory (FRAM), has a data processing speed equal to a dynamic random access memory (DRAM) and is able to retain data even in power off. For this reason, the nonvolatile ferroelectric memory has received much attention as a next generation memory device.

The FRAM and DRAM are memory devices having a similar structure, but the FRAM includes a ferroelectric capacitor having a high residual polarization characteristic.

The residual polarization characteristic permits data to be maintained even if an electric field is removed.

FIG. 1 shows a hysteresis loop of a typical ferroelectric.

As shown in FIG. 1, even if the electric field is removed from the polarization induced by the electric field, data is maintained at a certain amount (i.e., 'd' and 'a' states) due to a residual polarization (or spontaneous polarization).

A nonvolatile ferroelectric memory cell is used as a memory device by corresponding the 'd' and 'a' states to '1' and '0', respectively.

However, a related art ferroelectric hysteresis loop according to the related art reference cell operation has problems deviated from the hysteresis characteristics of the typical ferroelectric.

For a better understanding of the background technology, a cell array block, a main cell, and a reference cell of the nonvolatile ferroelectric memory device to apply a driving method of a reference cell will be explained hereinafter.

FIG. 2 shows a schematic diagram of a cell array block according to a nonvolatile ferroelectric memory device applicable to a driving method of a reference cell.

FIG. 3 is a schematic diagram of a main cell of FIG. 2, while FIG. 4 is a detailed circuit diagram of a reference cell of FIG. 2.

The cell array block includes a plurality of sub cell arrays. A sensing amplifier S/A is formed between adjacent top and bottom sub cell arrays sub_T and sub_B.

Each of the sub cell arrays includes bit lines Top_B/L and Bot_B/L, a plurality of main cells MC connected to the bit lines Top_B/L and Bot B/L, a reference cell RC connected to the bit lines Top B/L and Bot_B/L, and a column selector CS.

The reference cell RC within the top sub cell array sub_T S/A is simultaneously accessed when the main cell MC within the bottom sub cell array sub_B is accessed.

Similarly, the reference cell RC within the bottom sub cell array sub_B is simultaneously accessed when the main cell MC within the top sub cell array sub_T is accessed.

The column selector CS selectively activates a corresponding column bit line using Y (column) address.

If the column selector CS is in high level, the corresponding bit line is connected to a data bus, so as to enable a data transmission.

The main cell MC is constructed as shown in FIG. 3. A bit line B/L is formed in one direction, and a wordline W/L is formed to cross the bit line B/L. A plate line P/L is spaced apart from the wordline W/L in the same direction as the wordline W/L. A transistor T is formed with a gate connected to the wordline W/L and a source connected to the bit line B/L. A ferroelectric capacitor FC is formed in such a manner that a first terminal is connected to a drain of the transistor T and a second terminal is connected to the plate line 2/L.

The respective reference cell is constructed as shown in FIG. 4.

As shown in FIG. 4, the reference cell of the nonvolatile ferroelectric memory device includes a bit line B/L formed in one direction, a reference wordline REF_W/L formed across the bit line B/L, a switching block 51, a level initiating block 52, and a plurality of ferroelectric capacitors FC1, FC2, FC3, FC4, ..., and FCn. The switching block 51 is controlled by a signal of the reference wordline REF W/L to selectively transmit a reference voltage stored in the ferroelectric capacitors to the bit line B/L. The level initiating block 52 selectively initiates a level of an input terminal of the switching block 51 connected to the ferroelectric capacitors. The ferroelectric capacitors are connected to the input terminal of the switching block 51 in parallel.

The switching block 51 includes an NMOS transistor (hereinafter, "first transistor") T1 with a gate connected to the reference wordline REF_W/L, a drain connected to the bit line B/L, and a source connected to a storage node SN.

The level initiating block 52 is controlled by a reference cell equalizer control signal REF_EQ which is a control signal for initiating the storage node SN of the reference cell. Also, the level initiating block 52 includes an NMOS transistor (hereinafter, "second transistor") T2 connected between the source of the first transistor T1 and a ground terminal Vss.

The plurality of ferroelectric capacitors FC1, FC2, FC3, FC4, ..., and FCn include first and second electrodes, and a ferroelectric material formed between them. The first electrode of the ferroelectric capacitors is connected to the source of the first transistor T1, and the second electrode is connected to the reference plate line REF_P/L.

Herein, the number of the ferroelectric capacitors FC1, FC2, FC3, FC4, ..., and FCn is determined by the capacitor size of the reference cell. Thus, the number of the ferroelectric capacitors can freely be adjusted by changing the capacitor size of the reference cell.

The storage node SN is connected with first terminals of the ferroelectric capacitors FC1, FC2, FC3, FC4, ..., and FCn in parallel.

The reference cell equalizer control signal REF_EQ initiates the storage node SN to a ground voltage level. Namely, if the reference cell equalizer control signal REF_EQ is in high level, the second transistor T2 is turned on so that the storage node is maintained at a ground voltage level.

Operation of the aforementioned reference cell will now be described.

Qs and Qns of hysteresis loop in FIG. 1 denote switching charges of the ferroelectric capacitor, and non-switching charges of the ferroelectric capacitor, respectively. The reference cell of the present invention is based on Qns.

That is, the reference wordline REF_W/L within the operation cycle is transited to high level together with the reference plate line REF_P/L. Accordingly, charges equivalent to Qns X the size of ferroelectric capacitor are supplied to the bit line B/L.

At this time, the reference wordline REF_W/L is transited to low level before the sensing amplifier S/A is operated, so that the reference cell is not affected by a voltage of the bit line B/L.

Meanwhile, the reference plate line REF_P/L is maintained at high level, and transited to low level when the reference wordline REF_W/L is sufficiently stabilized to low level.

Since non-switching charges Qns are used, a separate restoring operation is not required during a precharge period. Accordingly, high level is no longer required in the reference wordline REF_W/L.

Since the reference level is affected by an initial level of the storage node, the second transistor T2 of FIG. 4 is used to stabilize the storage node, and the reference equalizer control signal REF_EQ is used to initiate the storage node to the ground voltage level.

Therefore, since the initial level of the storage node is maintained at the ground voltage level, the reference level can be stabilized.

Hereinafter, a hysteresis characteristic of the related art ferroelectric and a driving method of the reference cell of the related art nonvolatile ferroelectric memory device will be explained with reference to FIG. 5 and FIG. 6.

FIG. 5 shows a hysteresis characteristic of the related art ferroelectric, while FIG. 6 is a timing chart illustrating the operation of the related art reference cell.

The related art operation timing chart of the reference cell will be described as follows.

As shown in FIG. 6, an operation cycle begins when a chip enable signal CEBpad is transited to low level, so that active periods A, B, and C are formed. A precharge period D begins when the chip enable signal CEBpad is transited to high level. One cycle is completed by passing through the precharge period D.

If an active period of a chip begins, an address is decoded during the periods A and B. Also, all control signals are activated, and the reference wordline REF_W/L and the reference plate line REF_P/L are transited from low level to high level.

The reference cell data are transmitted to each bit line as the reference wordline REF_W/L and the reference plate line REF_P/L are transited from low level to high level in the period C.

The reference plate line REF_P/L is transited to low level in the precharge period D. Accordingly, a voltage is not applied between both electrodes of the ferroelectric capacitors of the reference cell as the reference plate line maintains low level in the rest of the precharge periods.

At the moment that the reference plate line REF_P/L is transited from high level to low level, the reference plate line is transited from 'a' state to 'b' state as time passes.

Therefore, a non-destructive charge is charged between Qns and Q'ns depending on how much time has passed since the reference plate line REF_P/L is transited from high level to low level.

Since the non-destructive charge is not constant, the reference bit line REF_B/L level maintained by the non-destructive charge is also changed.

Accordingly, since the reference level is not constant and varied due to the Qns and Q'ns, a sensing margin is reduced. This is because that the ferroelectric capacitor is damaged during an annealing process for a long time at a high temperature.

However, the aforementioned reference driving method of the related art nonvolatile ferroelectric memory device has the following problems.

Since the non-destructive charge is not constant, the reference bit line level is also changed. As a result, the reference level is not constant and changed due to Qns and Q'ns, thereby reducing a sensing margin.

SUMMARY OF THE INVENTION

Accordingly, the present invention is directed to a circuit for generating timing of a reference plate line in a nonvolatile ferroelectric memory device and a method for driving a reference cell that substantially obviates one or more of problems due to limitations and disadvantages of the related art.

Another object of the present invention is to provide a circuit for generating timing of a reference plate line in a nonvolatile ferroelectric memory device and a method for driving a reference cell that improves a sensing margin by stabilizing a reference level.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in a circuit for generating timing of a reference plate line in a nonvolatile ferroelectric memory device, wherein the nonvolatile ferroelectric memory device having a reference cell includes a switching block controlled by a reference wordline signal, a level initiating block which selectively initiates a level of an input terminal of the switching block after receiving a reference equalizer signal, and a plurality of ferroelectric capacitors connected in parallel between the input terminal of the switching block and the reference plate line, the circuit includes a latch circuit receiving a first signal which has the same waveform as that of a chip enable signal and is not delayed and a second signal which has the same waveform as that of the chip enable signal and is delayed for a certain period as the chip enable signal is generated, so as to output a low signal only in a delayed period of the second signal, and a delay circuit delaying the first and second signals of the latch circuit to output a low signal to the reference plate line.

In another aspect of the present invention, in a method for driving a reference cell of the nonvolatile ferroelectric memory device, wherein the reference cell includes a switching block controlled by a reference wordline signal, a level initiating block which selectively initiates a level of an input terminal of the switching block after receiving a reference equalizer signal, and a plurality of ferroelectric capacitors connected in parallel between the input terminal of the switching block and a reference plate line, the method includes transiting a chip enable signal from high level to low level by an external control signal, and activating the reference plate line to low level for a first period where the chip enable signal is transited to low level, and activating the reference wordline to high level for a second period where the reference plate line is transited from low level to high level while the chip enable signal is activated to low level.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

A capacity value of the nonvolatile ferroelectric memory cell can be changed if it is not driven for a long period of time. This is caused by a degradation of +Pr or −Pr value corresponding to an initial state of a cell capacitor. In other words, in a nonvolatile ferroelectric memory cell which is not driven for a short time, a difference in Pr values between a reference cell and a main cell increases due to a state difference between the reference cell and the main cell. As a result, a reference level becomes unstable.

In the present invention, it is intended to stabilize this unstable reference level.

A circuit for generating timing of a reference plate line in a nonvolatile ferroelectric memory device and a method for driving a reference cell will be described with reference to the accompanying drawings.

Figure 7:
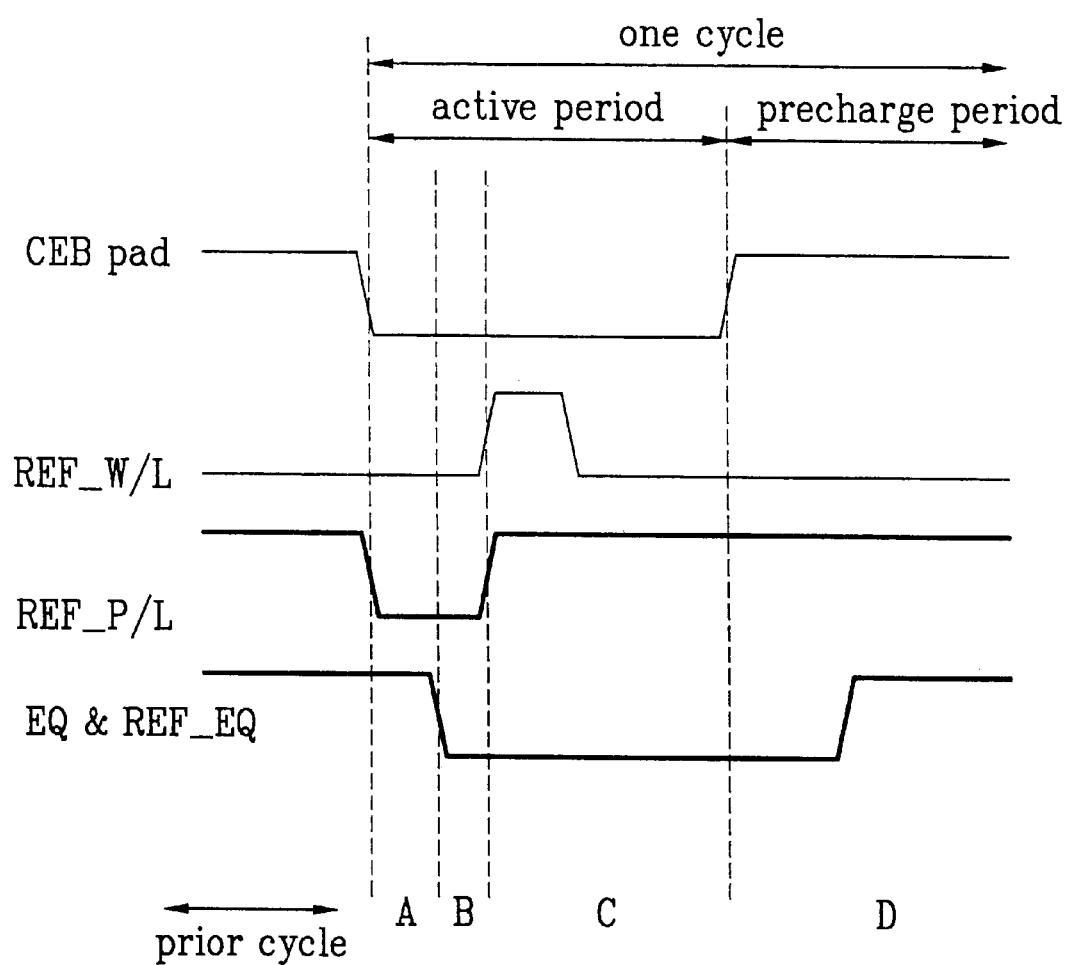
FIG. 7 illustrates a timing chart showing operation of a reference cell according to the present invention.

As shown in FIG. 7, an operation cycle is completed in such a manner that a chip enable signal CEBpad is transited to low level during active periods A, B, and C, and the chip enable signal CEBpad is transited to high level during a precharge period D. When the active periods begin, an address is decoded during the periods A and B. Also, all the control signals are activated, and the reference wordline REF_W/L and reference plate line REF_F/L are transited from low level to high level;

While the reference wordline REF_W/L and the reference plate line REF_P/L are transited from low level to high level in the period C, the reference cell data are transited to each bit line.

The reference plate line REF_P/L is maintained at high level in the precharge period D. That is, the reference plate line is maintained at low level only during the periods A and B of the active periods, and is maintained at high level during the rest of the periods.

Figure 1:
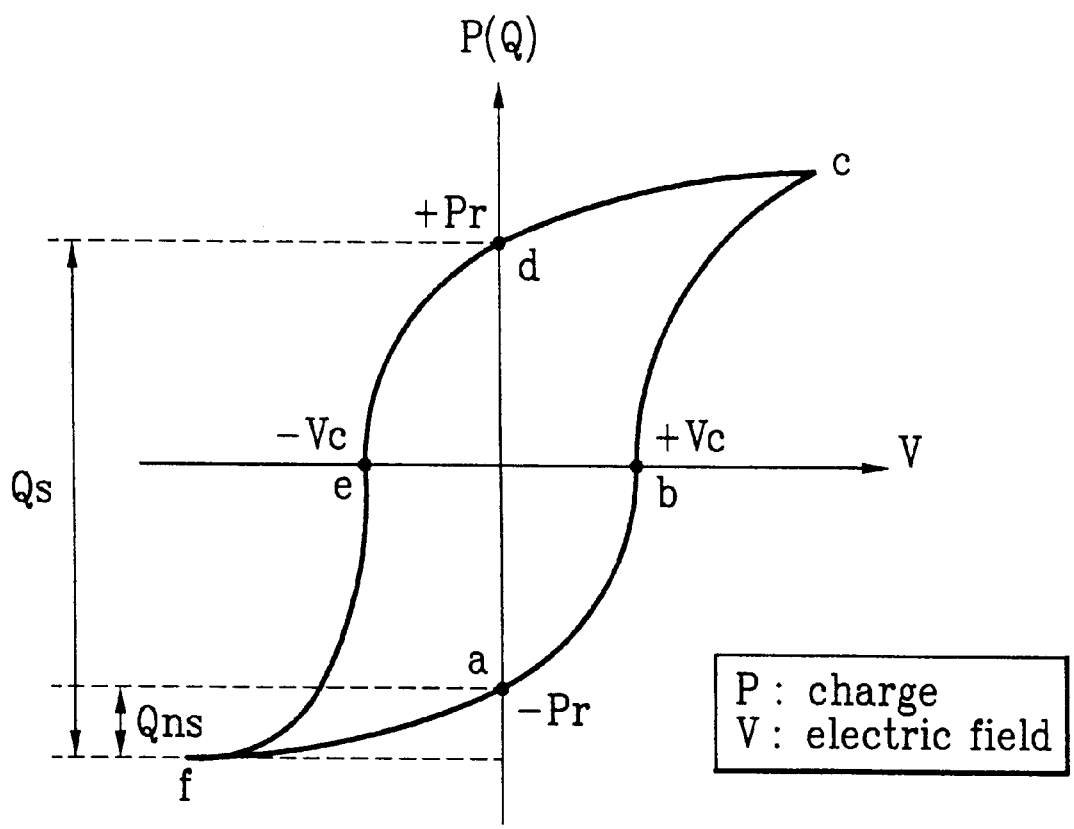
FIG. 1 illustrates a hysteresis loop of a typical ferroelectric.
Figure 2:
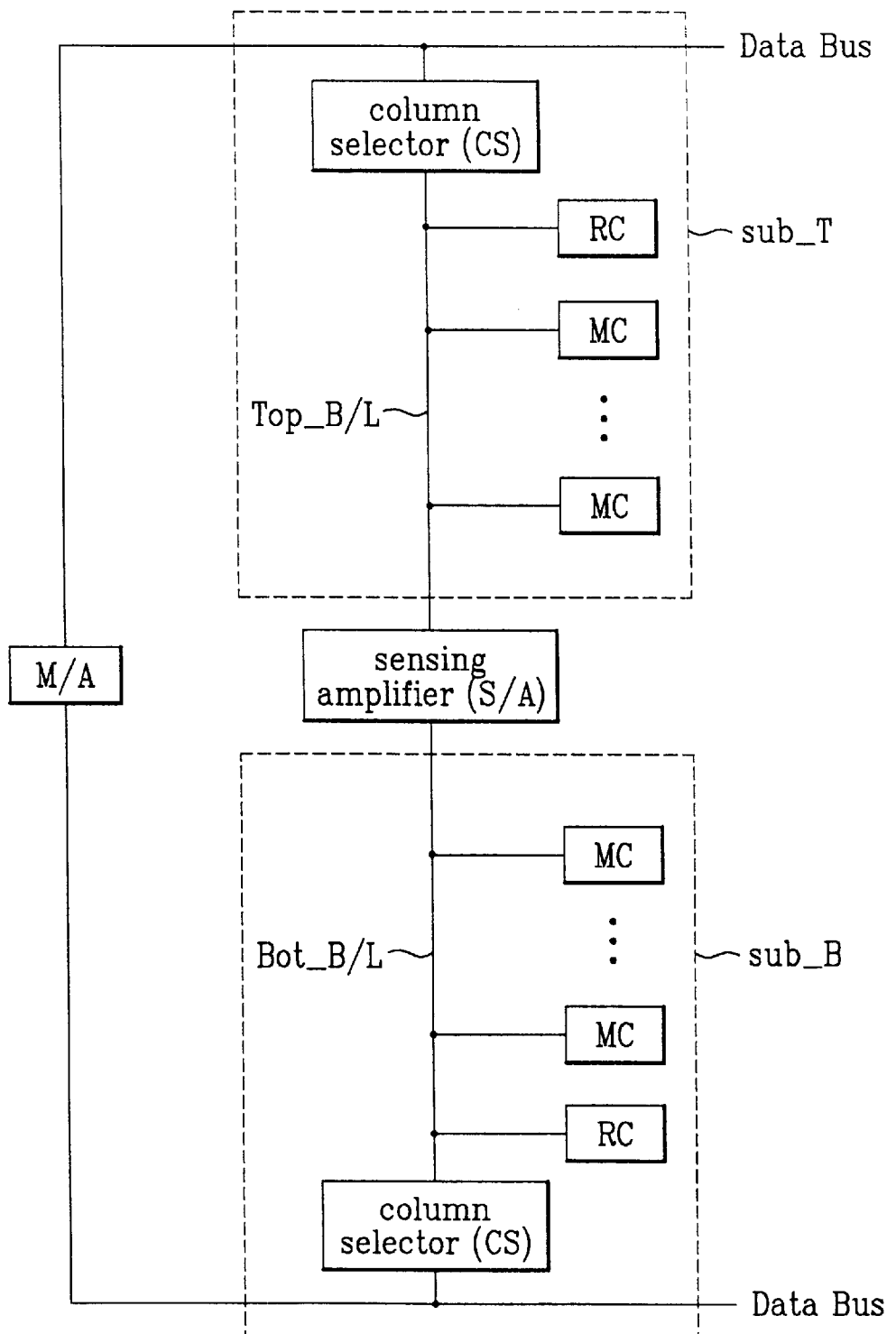
FIG. 2 illustrates a schematic diagram of a cell array block applicable to a driving method of a reference cell according to a nonvolatile ferroelectric memory device.
Figure 3:
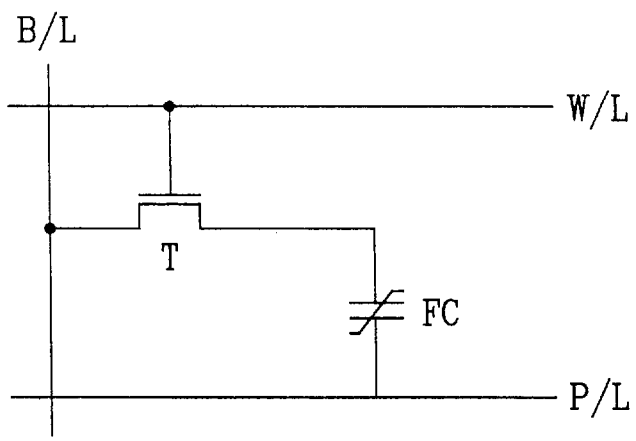
FIG. 3 illustrates a schematic diagram of a main cell of FIG. 2.
Figure 4:
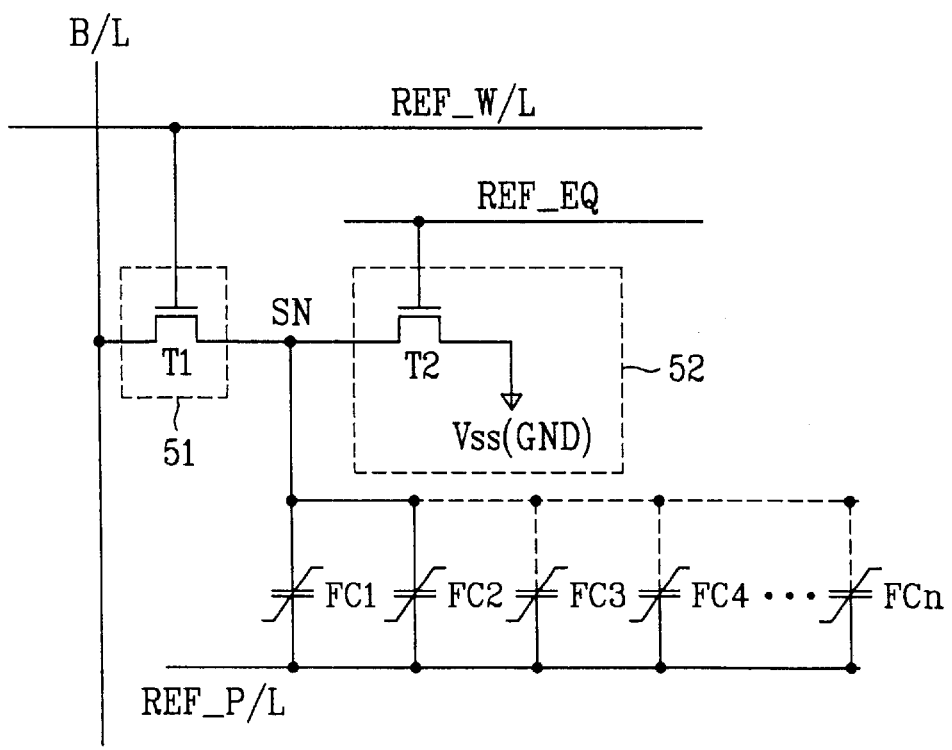
FIG. 4 illustrates a circuit diagram of a reference cell of FIG. 2.
Figure 5:
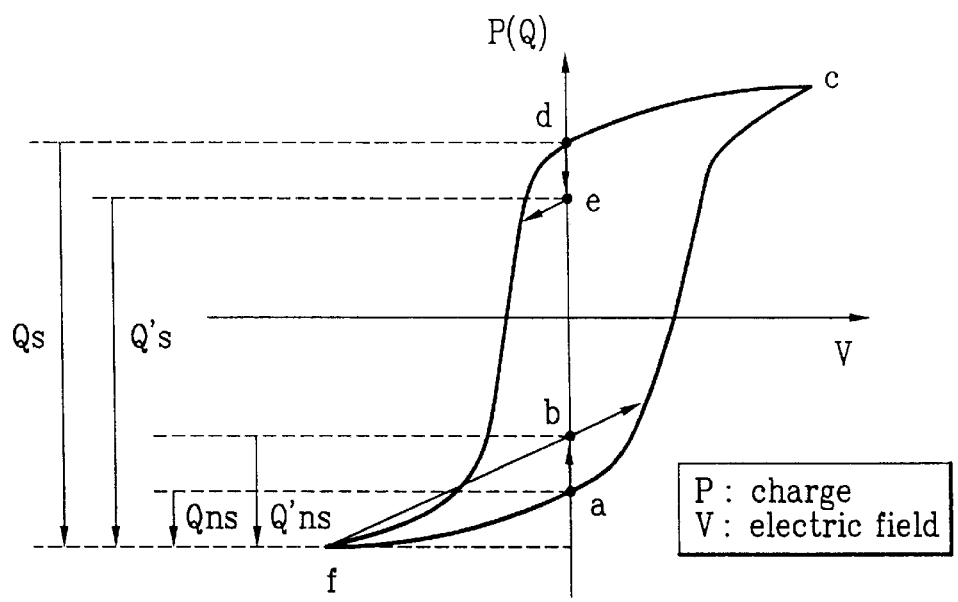
FIG. 5 illustrates a hysteresis loop of the related art ferroelectric.
Figure 6:
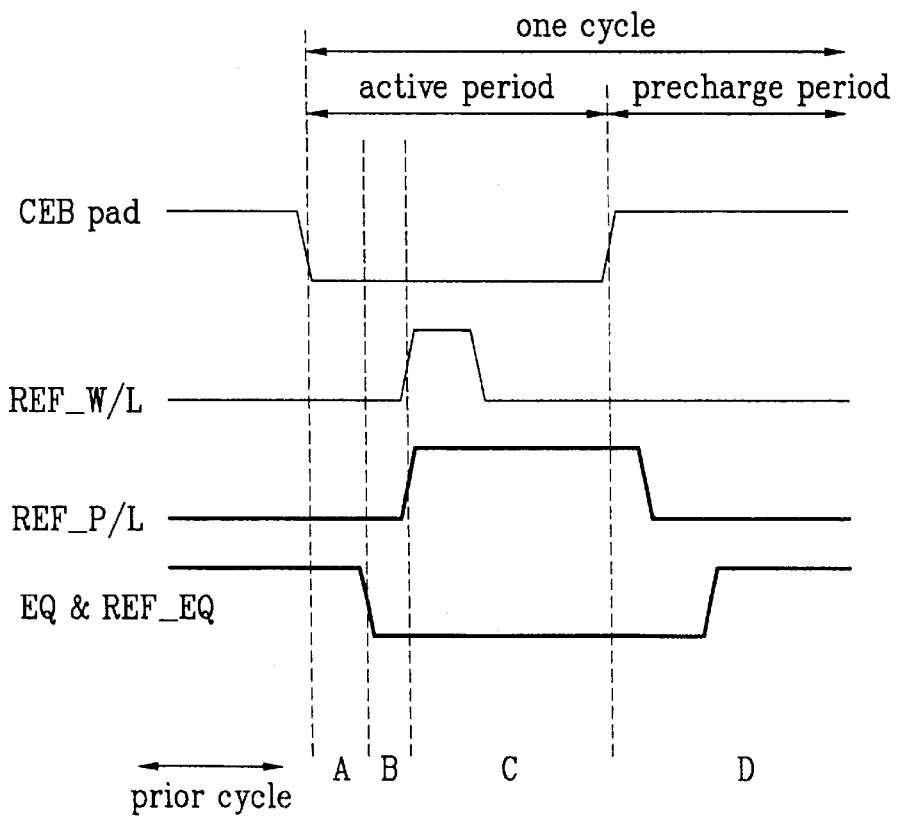
FIG. 6 illustrates a timing chart showing operation of a reference cell according to the related art.

Accordingly, if the power is turned on, the reference plate line REF_P/L is maintained at high level and located on 'f' state of FIG. 1.

When the active period begins, the reference plate line is transited from high level to low level and thus is transited from 'f' state to 'a' state of FIG. 1.

The reference plate line is maintained at low level only during the periods A and B. Accordingly, once the reference plate line is transited from low level to high level in a state that it is not transited from 'a' state to 'b' state, it is again transited from 'a' state to 'f' state, thereby resulting in that Qns charge is transited to the bit line B/L.

Accordingly, only Qns always exists, so that Q'ns does not exist.

Since the non-destructive charge is maintained at a constant value of Qns, the reference bit line level also becomes constant and a sensing margin is improved.

Especially, even though the ferroelectric capacitor is degraded during an annealing process for a long time due to a high temperature, the Qns is uniformly maintained. Thus, a good characteristic of the reference level is obtained in the present invention.

An equalizer signal EQ&REF_EQ of the memory cell region and the reference cell region is maintained at low level during a period from the active periods before the reference wordline is transited to high level to a period where the precharge period is started.

Hereinafter, a circuit for generating timing of the reference plate line according to the present invention will be described, in which the reference plate line REF$_{13}$ P/L generates low level only during a period before the reference word line REF_W/L is transited to high level in the active periods.

Figure 8A:
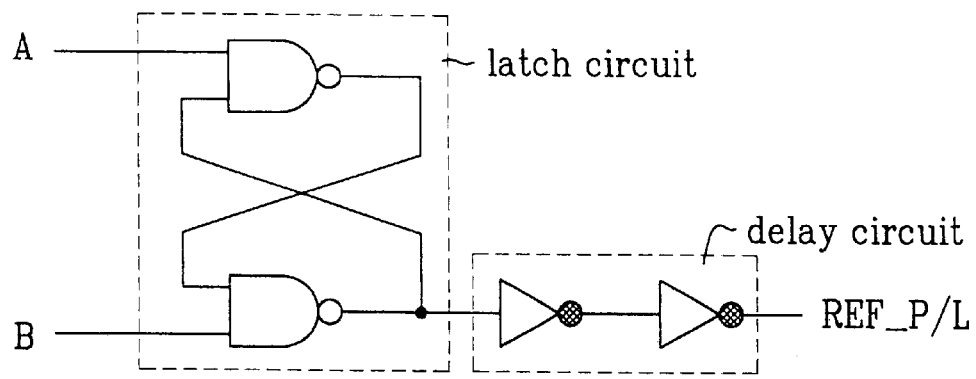
FIG. 8A illustrates a circuit diagram of a reference plate line according to the present invention.
Figure 8B:
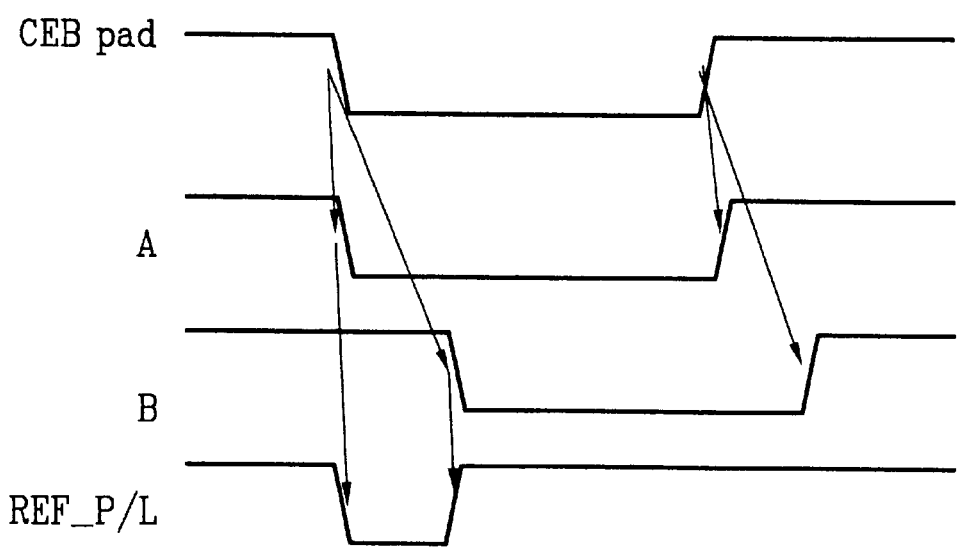
FIG. 8B illustrates a timing chart showing a reference plate line according to the present invention.

FIG. 8A is a diagram for a generating timing circuit of the reference plate line according to the present invention. FIG. 8B is a timing chart for generating timing of the reference plate line according to the present invention. The circuit for generating timing of the reference plate line, as shown in FIG. 8A, includes a latch circuit operated by receiving signals A and B, and a delay circuit delaying and outputting signals of the latch circuit.

The signals A and B are generated from output of the chip enable signal CEBpad, each having the operational waveform the same as that of the chip enable signal.

That is, the signal A is output at a waveform equal to the chip enable signal without a delay when the chip enable signal CEBpad is transited from high level to low level and activated. The signal B is output at a waveform equal to the chip enable signal after being delayed for a period for which the chip enable signal is transited from high level to low level.

The latch circuit includes two NAND gates, and the delay circuit includes two inverters connected in series.

The reference plate line signal generated through the circuit for generating timing of the reference plate line will be described with reference to FIG. 8A and FIG. 8B.

When the chip enable signal CEBpad is transited from high level to low level and is activated, an almost undelayed signal A and a significantly delayed signal B are generated.

When the signals A and B are inputted into the latch circuit of FIG. 8A, the reference plate line REF_P/L shows low level for the delayed period of the signal B.

Then, the delay circuit which received the signal of the latch circuit outputs low level to the reference plate line REF_P/L for the delayed periods of the signal B.

That is to say, the reference plate line REF_P/L is always maintained at high level for the rest of the periods except for the delayed periods of the signal B.

The circuit for generating timing of a reference plate line of a nonvolatile ferroelectric memory cell and the method for driving a reference cell have the following advantages.

The reference cell is not influenced by a relaxation degradation for the precharge period, so that the non-destructive charge Qns is maintained uniformly in the active periods. This uniformly maintains the reference bit line level, thereby improving a sensing margin.

It will be apparent to those skilled in the art that various modifications and variations can be made in the circuit for generating timing of a reference plate line in a nonvolatile ferroelectric memory device and a method for driving a reference cell of the present invention without departing from the spirit or scope of the inventions. Thus, it is intended that the present invention covers the modifications and variations of this invention provided they come within the scope of the appended claims and their equivalents.

What is claimed is:

1. A circuit for generating timing of a reference plate line in a nonvolatile ferroelectric memory device, having a reference cell that includes a switching block controlled by a reference wordline signal, a level initiating block which selectively initiates a level of an input terminal of the switching block after receiving a reference equalizer signal, and a plurality of ferroelectric capacitors connected in parallel between the input terminal of the switching block and the reference plate line, the circuit comprising:

a latch circuit receiving a first signal which has the same waveform as that of chip enable signal and is not delayed and a second signal which has the same waveform as that of the chip enable signal and is delayed for a first period as the chip enable signal is generated, so as to output a low signal only in a delayed period of the second signal; and a delay circuit delaying the first and second signals of the latch circuit to output a low signal to the reference plate line.

2. The circuit of claim 1, wherein the latch circuit includes two NAND gates.

3. The circuit of claim 1, wherein the delay circuit includes two inverters connected in series.

4. The circuit according to claim 1, wherein the delayed period of the second signal begins at a second period where the chip enable signal is transited from high level to low level and ends at a third period where the chip enable signal is maintained at low level.

5. A method for driving a reference cell of a nonvolatile ferroelectric memory device wherein the reference cell includes a switching block controlled by a reference word-line signal, a level initiating block which selectively initiates a level of an input terminal of the switching block after receiving a reference equalizer signal, and a plurality of ferroelectric capacitors connected in parallel between the input terminal of the switching block and a reference plate line, the method comprising:

transiting a chip enable signal from high level to low level by an address control signal;

activating the reference plate line to low level for a first period where the chip enable signal is transited to low level and the reference wordline is activated to low level; and activating the reference wordline to high level for a second period, which is after the first period, where the reference plate line is transited from low level to high level while the chip enable signal is activated to low level.

6. The method of claim 5, wherein the activated reference plate line to low level outputs first and second signals, wherein the first signal has the same waveform as that of the chip enable signal and is not delayed, and the second signal has the same waveform as that of the chip enable signal and is delayed for the first period.

7. The method of claim 6, wherein the first period is determined by the delayed period of the second signal.

8. The method of claim 5, wherein the reference equalizer signal is maintained at low level from the first period where the chip enable signal is transited to low level the second period where the chip enable signal is transited from low level to high level.

9. The method of claim 8, wherein the first period is an active period before the reference wordline is transited to high level.

* * * * *